United States Patent
Barbera et al.

(10) Patent No.: US 7,146,580 B2
(45) Date of Patent: Dec. 5, 2006

(54) INTERCHANGEABLE INTEGRATED CIRCUIT BUILDING BLOCKS

(75) Inventors: George Edward Barbera, Pheonix, AZ (US); David Donald Jensen, Glendale, AZ (US); Xiaohui You, Rowland Heights, CA (US)

(73) Assignee: Broadcom Corporation, Irvine, CA (US)

( * ) Notice: Subject to any disclaimer, the term of this patent is extended or adjusted under 35 U.S.C. 154(b) by 211 days.

(21) Appl. No.: 10/916,604

(22) Filed: Aug. 12, 2004

(65) Prior Publication Data

US 2006/0036972 A1    Feb. 16, 2006

(51) Int. Cl.
*G06F 17/50* (2006.01)

(52) U.S. Cl. .................. 716/1; 716/8; 716/9; 716/10

(58) Field of Classification Search .................. 716/17, 716/8, 9, 10, 11, 1
See application file for complete search history.

(56) References Cited

U.S. PATENT DOCUMENTS

| | | | | |
|---|---|---|---|---|
| 4,245,249 A | * | 1/1981 | Tissot | 348/180 |
| 5,076,375 A | * | 12/1991 | Dillon et al. | 177/45 |
| 5,097,422 A | * | 3/1992 | Corbin et al. | 716/8 |
| 5,210,701 A | * | 5/1993 | Hana et al. | 716/1 |
| 5,656,904 A | * | 8/1997 | Lander | 318/568.12 |

* cited by examiner

*Primary Examiner*—Sun James Lin
(74) *Attorney, Agent, or Firm*—Sterne, Kessler, Goldstein & Fox PLLC

(57) ABSTRACT

Interchangeable integrated circuit building blocks include functionally equivalent integrated circuit building blocks, having similar footprints, and having one or more dissimilar features or operational characteristics. The functionally equivalent integrated circuit building blocks are interchangeable in a design layout without having to re-place and re-route. The functionally equivalent integrated circuit building blocks are optionally interchangeable on a building block by building block basis. One or more detection features are optionally included in one or more of the interchangeable integrated circuit building blocks. The detection features facilitate detection of the interchangeable integrated circuit building blocks. Area, space, and/or width design rule checks are optionally focused at junctions of detected integrated circuit building blocks.

21 Claims, 12 Drawing Sheets

INTERCHANGEABLE INTEGRATED CIRCUIT BUILDING BLOCKS

BACKGROUND OF THE INVENTION

1. Field of the Invention

The invention relates to integrated circuits and, more particularly, to interchangeable integrated circuit building blocks.

2. Related Art

An integrated circuit building block is a computer-based blueprint for fabricating functionality in an integrated circuit, such as a CMOS circuit. An integrated circuit building block typically includes mask information for fabricating the circuit, and associated area, size, and pin information.

During a front end portion of a design process, hardware design language ("HDL") source code is converted to integrated circuit building blocks and interconnections. During a back-end portion of the design process, the integrated circuit building blocks are placed and routed in a design layout. The design layout is analyzed to determine if it meets design criteria, such as timing and/or power consumption requirements. If design criteria are not sufficiently attained, the design is revised. For example, when a path through a series of interconnected integrated circuit building blocks does not meet timing requirements (i.e., a critical timing path), one or more of the integrated circuit building blocks within the path can be replaced with functionally equivalent, but faster components.

In conventional systems, functionally equivalent integrated circuit building blocks having different operating characteristics, have different footprints (i.e., different place and route footprints and different metal, polysilicon, and/or diffusion layer footprints). Thus, the integrated circuit building blocks are not easily interchanged. Instead, a number of surrounding integrated circuit building blocks typically have to be interchanged, re-placed, and re-routed. This often involves an iterative refinement process between the front-end and back-end processes. This consumes time and computational resources, sometimes taking days, weeks, or months.

What is needed, therefore, is a method and system for interchanging functionally equivalent integrated circuit building blocks having different operating characteristics, without having to re-place and re-route. What is also needed is a method and system for interchanging integrated circuit building blocks on a building block by building block basis, without having to re-place and re-route.

SUMMARY OF THE INVENTION

The present invention is directed to interchangeable integrated circuit building blocks. The invention provides functionally equivalent integrated circuit building blocks, having similar footprints, and having one or more dissimilar features or operational characteristics. (Typically, one or more integrated circuit layers associated with the dissimilar features or operational characteristics will have a smaller footprint than the remaining layers, to accommodate a detection feature as described below, but place and route footprints are generally the same). The functionally equivalent integrated circuit building blocks are interchangeable in a design layout without having to re-place and re-route.

One or more detection features are optionally included in one or more of the interchangable integrated circuit building blocks. The detection features allow detection of the interchangable integrated circuit building blocks. Area, space (e.g., separation distance), and/or width (e.g., width of a strip of material), design rule checks are optionally focused at junctions of detected integrated circuit building blocks.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure particularly pointed out in the written description and claims hereof as well as the appended drawings.

It is to be understood that both the foregoing summary and the following detailed description are exemplary and explanatory and are intended to provide further explanation of the invention as claimed.

BRIEF DESCRIPTION OF THE DRAWINGS/FIGURES

The present invention will be described with reference to the accompanying drawings, wherein like reference numbers indicate identical or functionally similar elements. Also, the leftmost digit(s) of the reference numbers identify the drawings in which the associated elements are first introduced.

FIG. 14 illustrates the building blocks 1204 and 1206 with the fill pattern 1302 there between.

DETAILED DESCRIPTION OF THE INVENTION

I. Introduction

Figure 1:
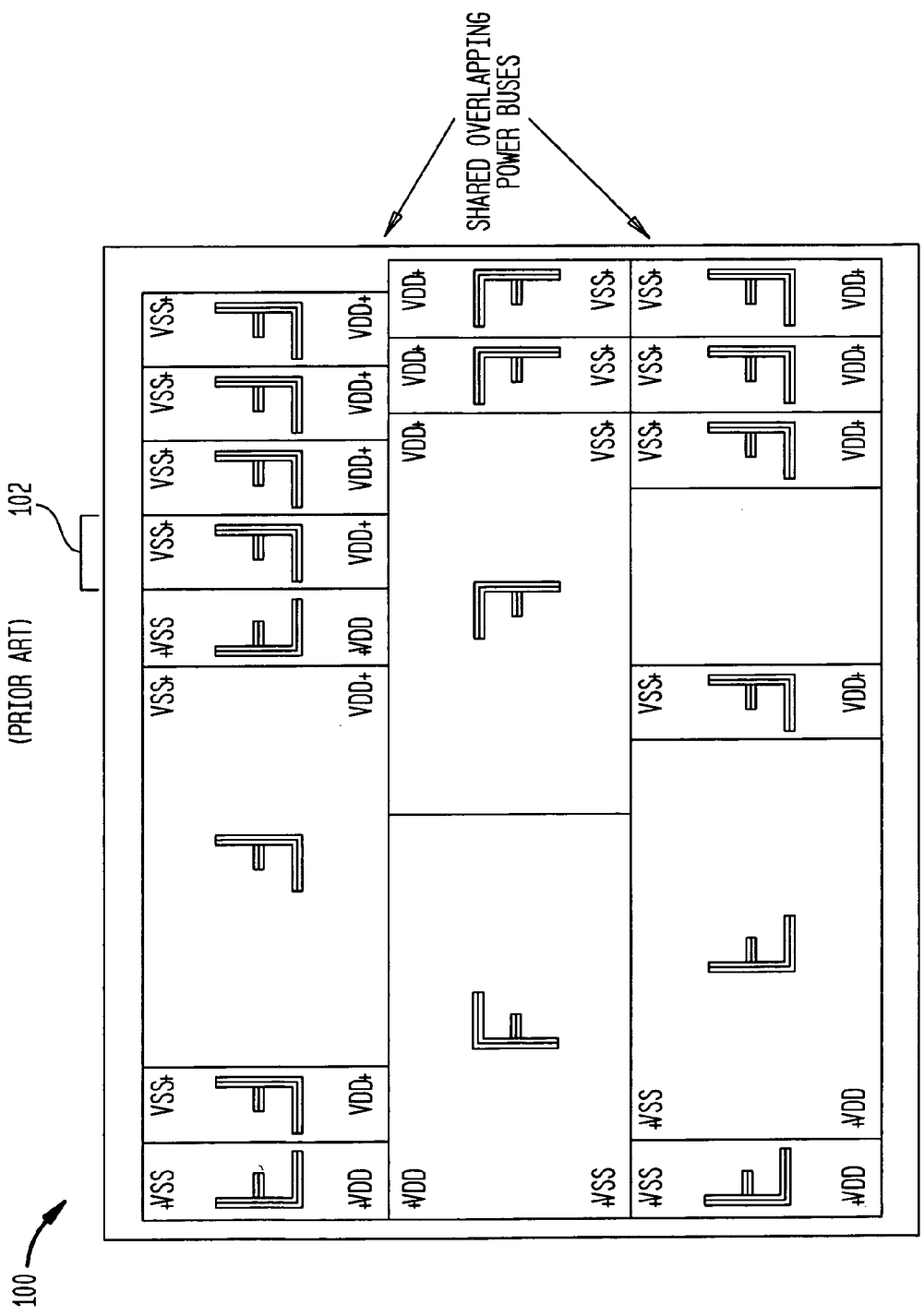
FIG. 1 is an example placement orientation diagram of integrated circuit building blocks.

The invention is directed to interchangeable integrated circuit building blocks. The invention provides, among other features, an integrated circuit building block architecture, where two or more functionally equivalent integrated circuit building blocks have the same footprint and one or more different features and/or operating characteristics. The integrated circuit building blocks are interchangeable with one another, at the same placement location, without having to re-place and re-route.

In accordance with an aspect of the invention, a library of integrated circuit building blocks includes one or more sets of interchangable integrated circuit building blocks, wherein members of a given set have similar functionality and footprints, and one or more dissimilar features and/or operating characteristics.

In one embodiment, the present invention is utilized as part of an iterative process where integrated circuit building blocks are iteratively interchanged and analyzed until a desired design criteria is converged upon, without having to re-run place and route operations.

II. Interchangeable Characteristics

Interchangeable integrated circuit building blocks are designed to provide one or more of a variety of different characteristics and/or operating features. Variable characteristics include, for example and without limitation, gate length, voltage threshold level, radiation hardness, well depth, and oxide thickness. Interchangeable integrated circuit building blocks can be interchanged to optimize one or more of a variety of such characteristics.

Integrated circuit building blocks include multiple layers of material such as conductive material, semi-conductive material, and non-conductive material. Operating characteristics of integrated circuit building blocks depend on the presence or absence of one or more particular layers, and layer features such as material, thickness, and/or etching patterns.

For example, voltage threshold refers to the turn-on voltage of a transistor. Voltage threshold is affected by a voltage threshold layer of an integrated circuit. As the voltage threshold is lowered, the transistor turns on faster (i.e., faster response). Lower voltage threshold, however, results in greater leakage current, which consumes additional power. Interchangeable integrated circuit building blocks can thus be interchanged to, for example, optimize between speed and power consumption.

III. Area, Space, and Width Rules

Integrated circuit designs follow design rules provided by fabrication facilities. The design rules include area, space and width rules that insure, among other things, that the fabrication process does not involve etching a portion of a layer that could be too small to safely remove, thus contaminating the integrated circuit.

Area, space and width rules apply to adjacent integrated circuit building blocks. When a first integrated circuit building block is adjacent to a second integrated circuit building block, corresponding layers of the first and second integrated circuit building blocks must comply with the area, space, and width rules. This is described below with reference to FIGS. 1 and 2.

FIG. 1 is an example placement orientation diagram 100 of integrated circuit building blocks. FIG. 1 includes a plurality of integrated circuit building blocks 102. The height of each integrated circuit building block is typically the same, but widths can vary.

Figure 2A:
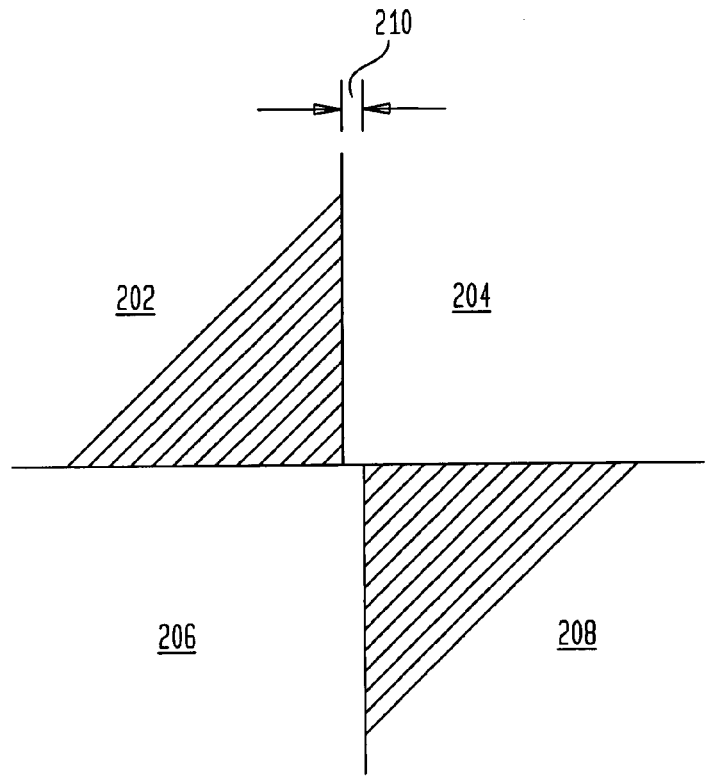
FIG. 2A illustrates a junction of four integrated circuit building blocks.

When integrated circuit building blocks, having one or more dissimilar layer properties, are placed adjacent to one another, there may be an area, width, or space violation. For example, FIG. 2A illustrates a junction of four integrated circuit building blocks 202, 204, 206, and 208. The illustrated layer of integrated circuit building blocks 202 and 208 are made of a first material. The corresponding layers of integrated circuit building blocks 204 and 206 are made of a second material. A gap 210 exists between the adjacent corners of integrated circuit building blocks 202 and 208. The gap 210 may violate an area, width, or space rule.

Figure 2B:
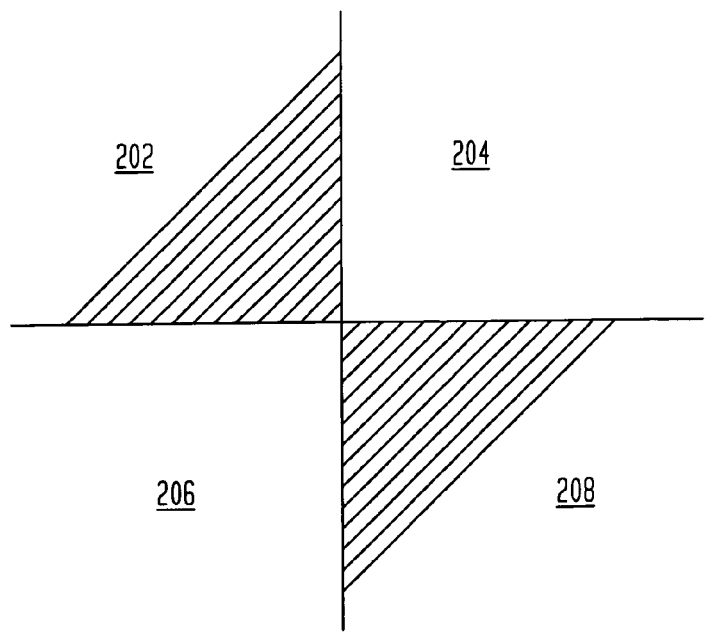
FIG. 2B illustrates another junction of four integrated circuit building blocks.

FIG. 2B illustrates the junction of the four integrated circuit building blocks 202, 204, 206, and 208, without the gap 210. In the example of FIG. 2B, corner regions of the integrated circuit building blocks 202, 204, 206, and 208, may violate an area, width, or space rule.

The gap of FIG. 2A, and/or the lack thereof of FIG. 2B, may be extremely small and difficult to fix. Accordingly, an interchangeable integrated circuit building block is optionally provided with a detection feature that allows instances of the integrated circuit building block to be detected. The detected interchangeable integrated circuit building block is then tested for area, space and/or width rule violations. Violations are corrected by, for example, filling in the gap.

As a result, two or more integrated circuit building blocks having different layer characteristics can be placed next to one another, and any area, space and/or width violations can be identified and corrected.

One or more of a variety of detection features can be utilized. Detection features can include, for example, and without limitation, detectable area anomalies, such as notched patterns formed in one or more layers of the integrated circuit building blocks. Alternatively, or additionally, detection features can include letter coding or naming conventions associated with integrated circuit building blocks.

A notched pattern can be, for example, a boundary notch indicating an absence of layer material. A notched pattern is designed to intentionally create design rule check ("DRC") errors to focus the DRC at the intersection of the building blocks.

For example, a DRC tool can be modified to include an algorithm to detect the notched pattern. The modified DRC tool then focuses on the surrounding area to detect any area, space, and/or width violations. The DRC tool looks at openings and corners to determine whether they are wide enough and whether there is enough space. If so, the area is left as is. If not, the area is filled, or additional space is created. The tool can select a fill shape from one or more selectable patterns. The one or more patterns can include, for example, boot shapes, squares, and/or rectangles.

IV. Example Embodiment

An example embodiment of the invention is provided below. In the example embodiment, interchangeable integrated circuit building blocks include different voltage threshold layers, and the detection feature includes notched patterns formed in the voltage threshold layers. The invention is not, however, limited to the example embodiment described below.

Conventional libraries provide a standard voltage threshold for an entire library, or provide a selectable voltage threshold on a section by section basis, where each section includes a plurality of integrated circuit building blocks. The present invention, on the other hand, allows on-the fly substitution of one voltage threshold model for another, without having to do a new place and route. This allows designers to select voltage threshold levels on a building block by building block basis, rather than on a section by section basis.

Figure 3:
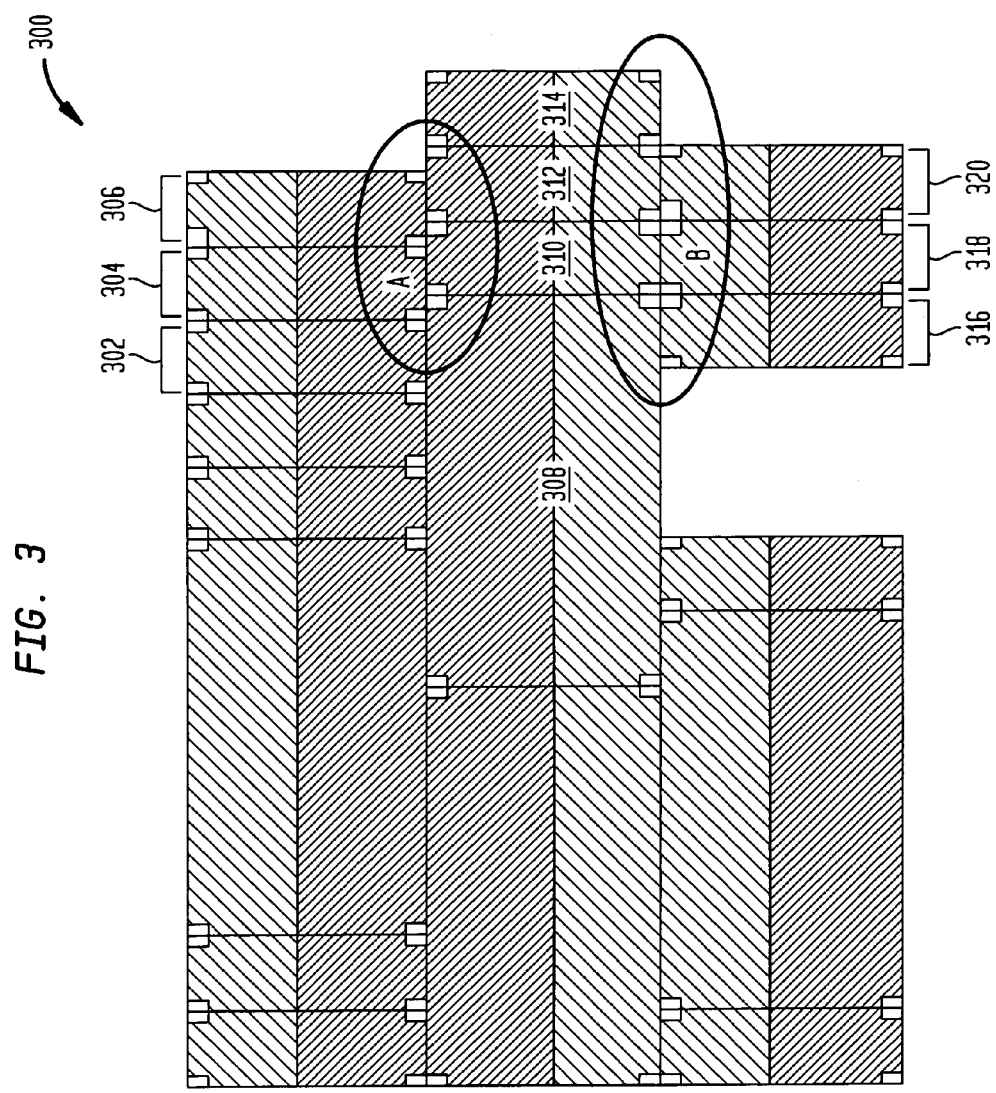
FIG. 3 is a diagram of a portion of an integrated circuit layout.

FIG. 3 is a diagram of portion 300 of an integrated circuit layout. Portion 300 includes integrated circuit building blocks 302–320. Hash lines indicate a first layer material, such as voltage threshold material. Absence of hash lines indicates absence of the layer material. Alternatively, absence of hash lines indicates a second layer material (e.g.; higher or lower voltage threshold material). For the remainder of this example, hash lines are treated as voltage threshold material, and absence of hash lines is treated as an absence of second layer material. The invention is not, however, limited to this example.

Further regarding the hash lines, in the example of FIG. 3, fine hash lines indicate voltage threshold material for a PMOS portion of an integrated circuit building block. Coarse hash lines indicate voltage threshold material for an NMOS portion of a integrated circuit building block. The invention is not, however, limited to this example.

The integrated circuit building blocks that include hash marks, also include corner notches that serve as detection features. The corner notches indicate an absence of the voltage threshold material. The notches signify that the corresponding integrated circuit building blocks include the voltage threshold material. When the notches are detected by a DRC tool, the DRC tool initiates a closer examination of the notch area, for area, space and width violations. One or more optional algorithms are provided to assist the DRC tool in detecting the corner notches or other detection features.

Figure 5:
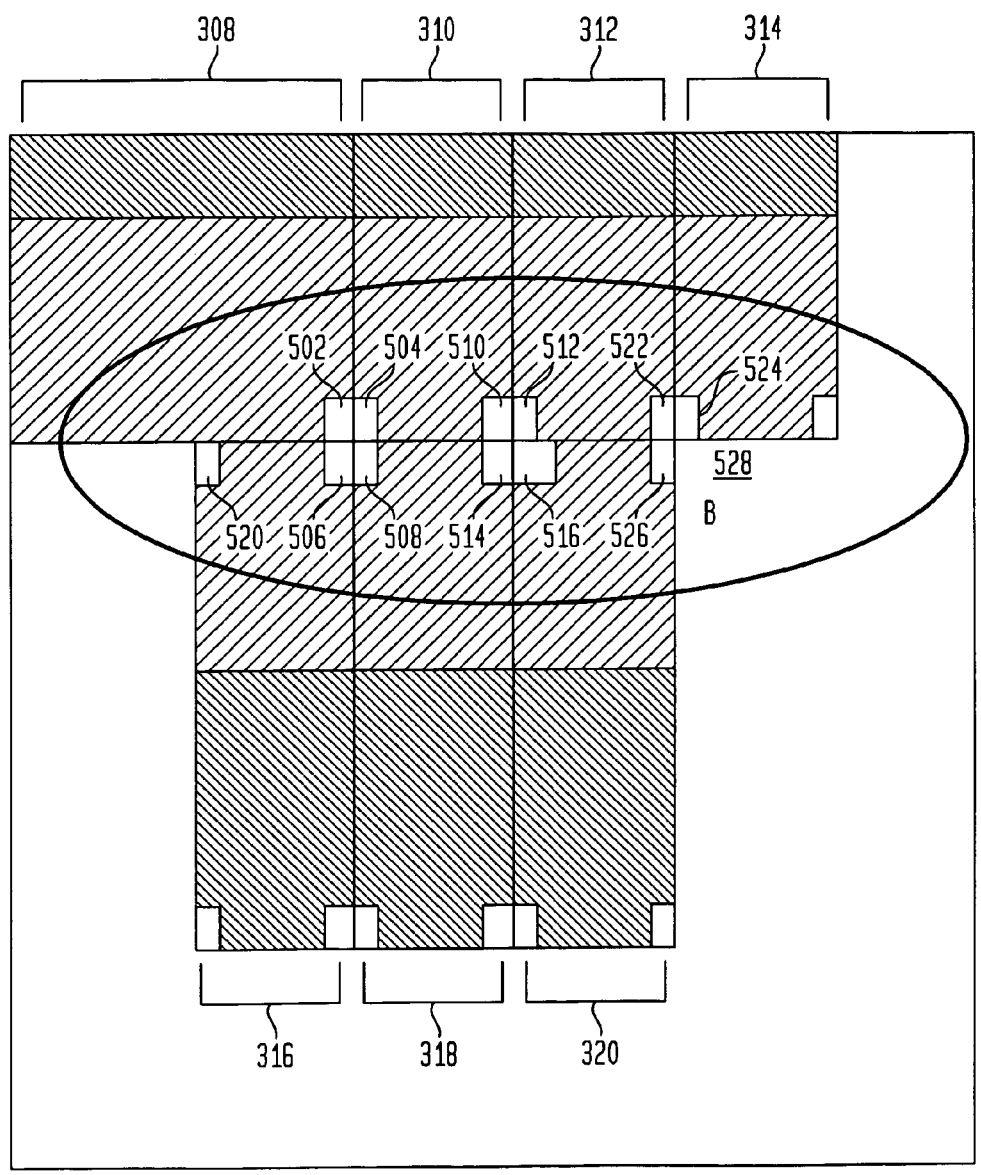
FIG. 5 is an expanded view of portion B of FIG. 3.
Figure 6:
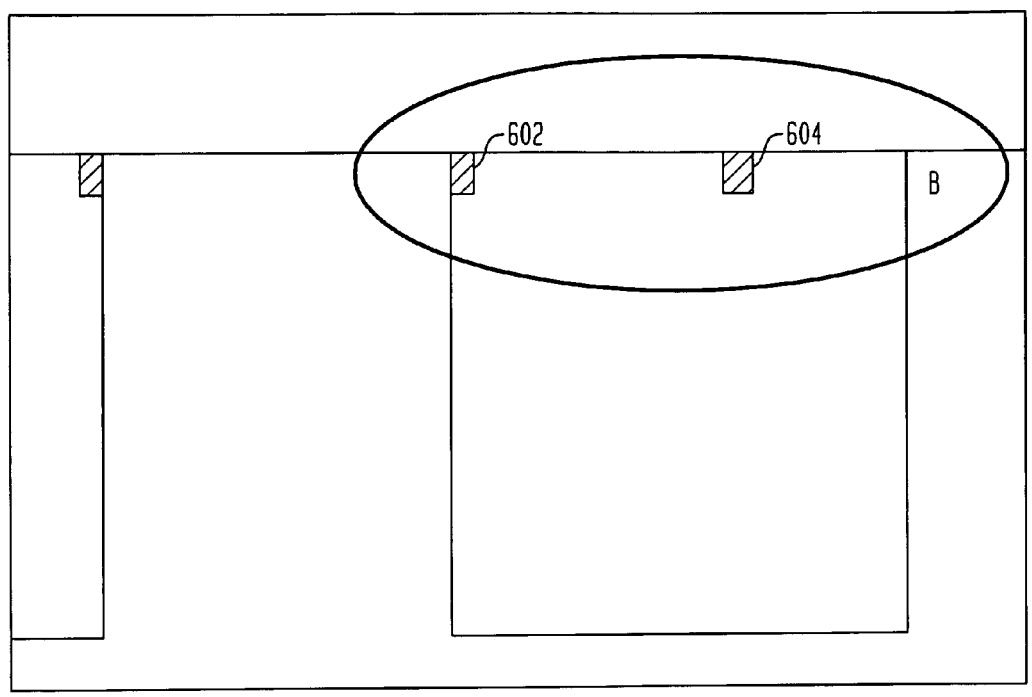
FIG. 6 illustrates the expanded view of FIG. 5, with example fill patterns for selected notches.
Figure 7:
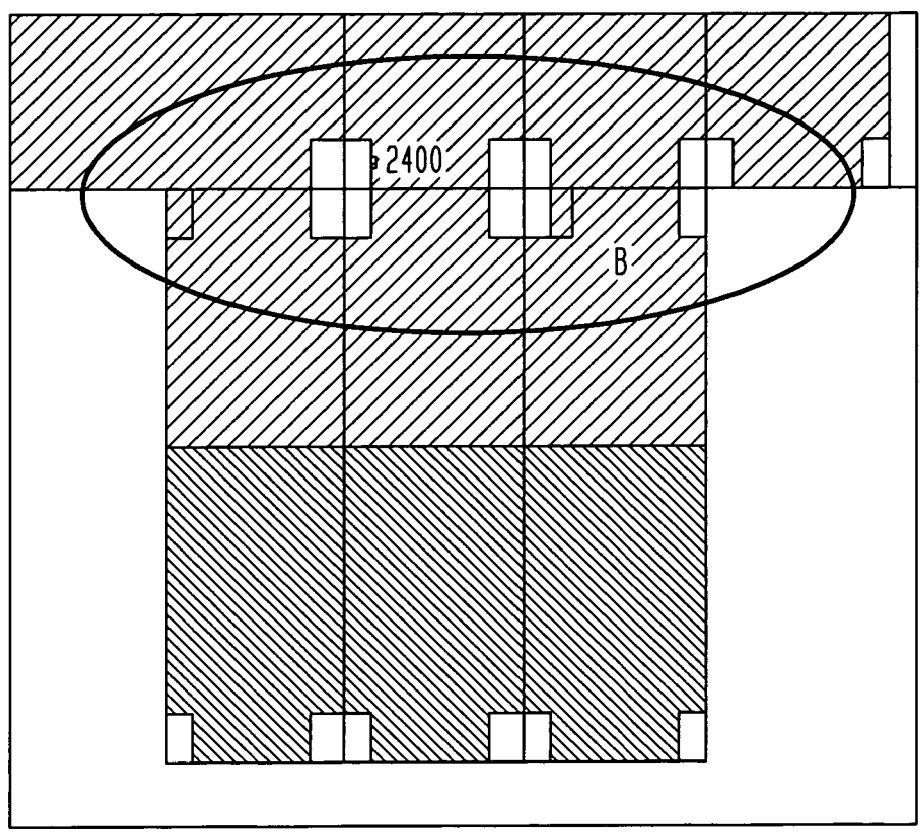
FIG. 7 illustrates the fill pattern of FIG. 6, merged with surrounding layer material.

In FIG. 3, a circle B encompasses intersections of integrated circuit building blocks 308–320. An expanded view of circle B is provided in FIG. 5. FIG. 6 illustrates the expanded view of FIG. 5, with example fill patterns for selected notches associated with the intersections of integrated circuit building blocks 308–320. FIG. 7 illustrates the fill pattern of FIG. 6, merged with surrounding layer material. FIGS. 5, 6, and 7 are described below.

FIG. 5 includes notches 502–520. The notches are sized to be detectable to a DRC tool. In one embodiment, the notches are sized to violate area, space, and/or width rules. In such an embodiment, an individual notch, surrounded by layer material (hash lines), will be filled in.

For example, in FIG. 5, integrated circuit building block 316 includes notch 520, which is bounded on three sides by layer material. Notch 520 thus violates width, size, and/or area rules and is filled in. This is represented in FIG. 6 by fill pattern 602.

The notches are optionally sized such that, when four notches are joined at a common point to form a rectangle, the rectangle does not violate area, size, or width rules.

For example, in FIG. 5, integrated circuit building blocks 308, 310, 316, and 318, intersect at a common point bounded by notches 502, 504, 506, and 508. Notches 502, 504, 506, and 508 thus abut one another so as to form a rectangle. As noted above, the notches are sized to be detected by a DRC tool. A subsequent DRC check will determine whether the combined notches 502, 504, 506, and 508 violate area, size, or width rules.

In this example, the resulting rectangle is of a size that does not violate area, size, or width rules. As a result, the notches 502, 504, 506, and 508 are left as is. In other words, notches 502, 504, 506, and 508 are not filled in with voltage threshold material. In FIG. 6, therefore, there is no corresponding fill pattern for notches 502, 504, 506, and 508.

Alternatively, since the notches 502, 504, 506, and 508 are surrounded by layer material, the notches 502, 504, 506, and 508 are optionally filled with layer material. This, however, would require additional steps. Since transistors are generally not placed near the edge of a building block, there is no need to fill in the rectangle with layer material. The extra steps are thus optionally avoided and the notches 502, 504, 506, and 508 are left alone.

Similarly, notches 512, 512, 514, and 516 form a rectangle of suitable area, size, and width, so that notches 512, 512, 514, and 516 do not need to be filled.

Notch 518 is similar to notch 520. Although notch 518 abuts notch 512, notch 518 is surrounded on three sides by layer material and thus has a width, shape and/or area that violates the DRC rule. Notch 518 is thus filled in, as illustrated in FIG. 6 by notch pattern 604.

In FIG. 5, notches 522, 524, and 526, meet at a common point and, with a portion of an adjacent area 528, form a rectangle absent of layer material. As with the rectangles described above, the rectangle formed by notches 522, 524, and 526 are of suitable area, size, and width, so that notches 522, 524, and 526 do not need to be filled.

In FIG. 7, the fill pattern of circle B from FIG. 6 is illustrated as merged with surrounding layer material.

Figure 4:
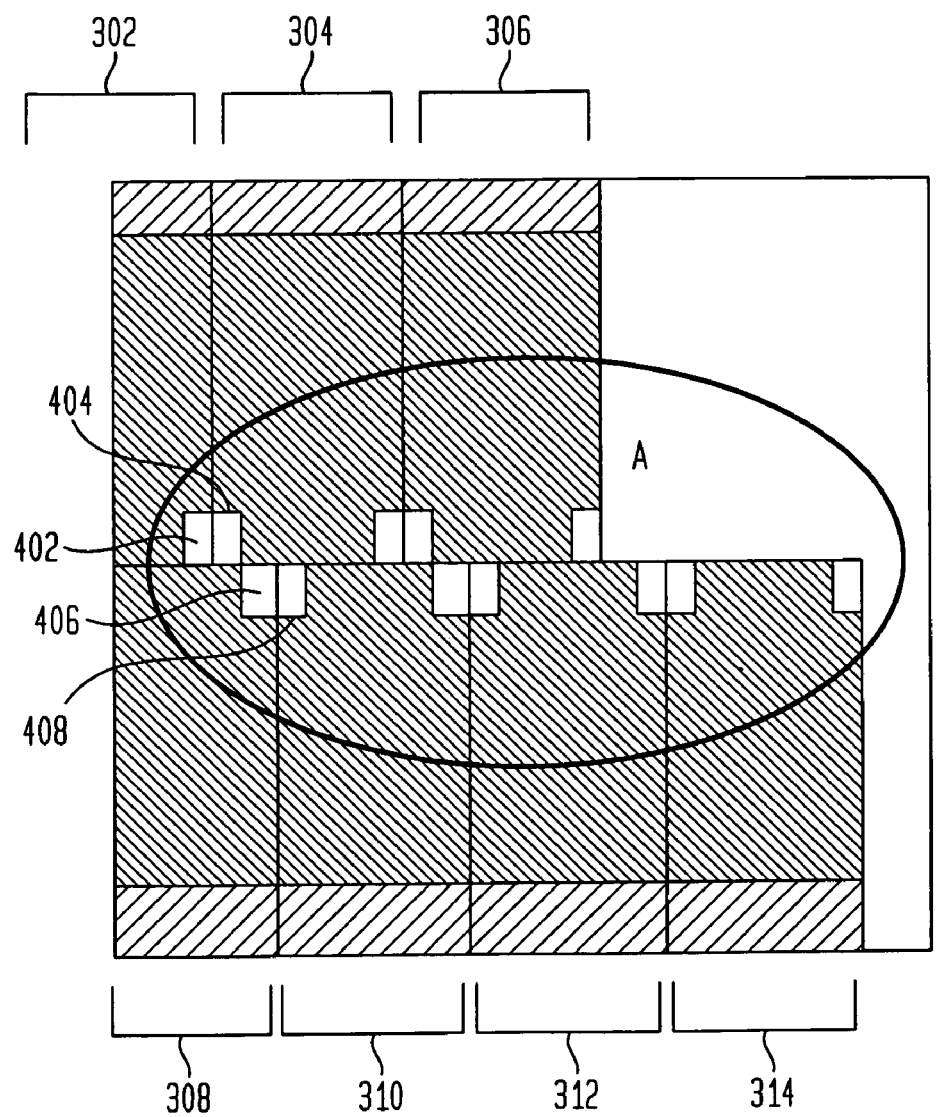
FIG. 4 is an expanded view of a portion A of FIG. 3.
Figure 8:
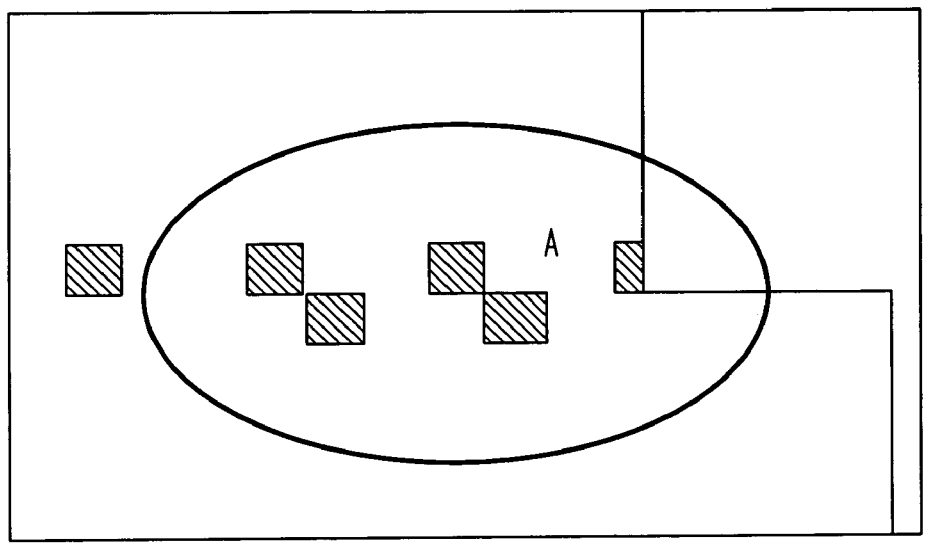
FIG. 8 illustrates the expanded view of FIG. 4, with example fill patterns for selected notches.
Figure 9:
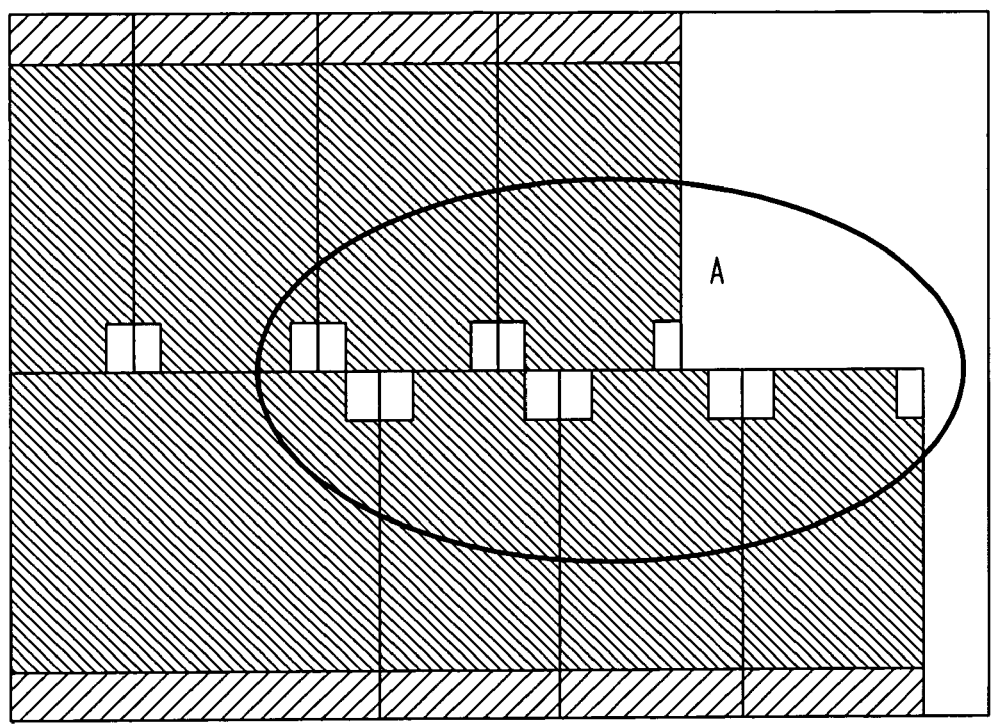
FIG. 9 illustrates the fill pattern of FIG. 8, merged with surrounding layer material.

Referring back to FIG. 3, a circle A encompasses intersections of integrated circuit building blocks 302–314. An expanded view of circle A is provided in FIG. 4. FIG. 8 illustrates the expanded view of FIG. 4, with example fill patterns for selected notches associated with the intersections of integrated circuit building blocks 302–314. FIG. 9 illustrates the fill pattern of FIG. 8, merged with surrounding layer material. FIGS. 4, 8, and 9 are described below.

FIG. 4 includes notches 402–408. Notches 402 and 404 form a rectangle. Notches 406 and 408 form another rectangle. In the illustrated example, the rectangles formed by notches 402 and 404, and notches 406 and 408, each violate area, space, and/or width violations. In FIG. 8, therefore, the rectangles are filled with patterns 802 and 804, respectively.

Alternatively, the rectangles formed by notches 402 and 404, and notches 406 and 408, do not themselves violate area, space, and/or width rules. Instead, the DRC tool includes one or more algorithms to detect the notches. The DRC tool then focuses on the surrounding area to detect any area, space, and/or width rule violations. For example, the small sliver of material between the rectangles 404 and 406 may violate area, space, and/or width rules. Thus, in either event, notches 402, 404, 406, and 408 are filled in, as illustrated in FIG. 8.

Referring back to FIG. 4, the remaining notches illustrated in circle A fall within one or more of the situations described above with respect to circle A and/or B. The resultant fill patterns are illustrated in FIG. 8.

Figure 10:
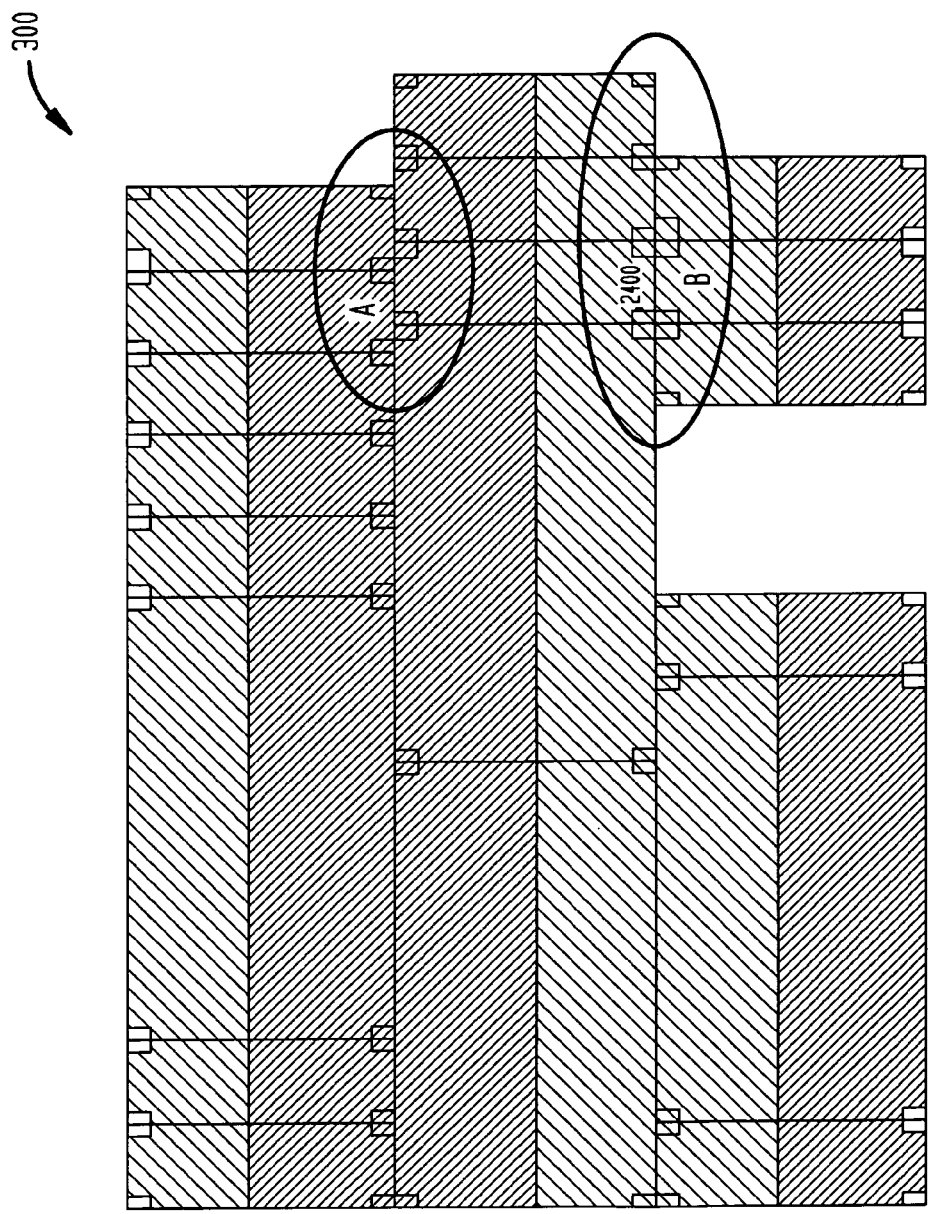
FIG. 10 illustrates the fill patterns of FIGS. 7 and 9, merged with surrounding layer material.
Figure 11:
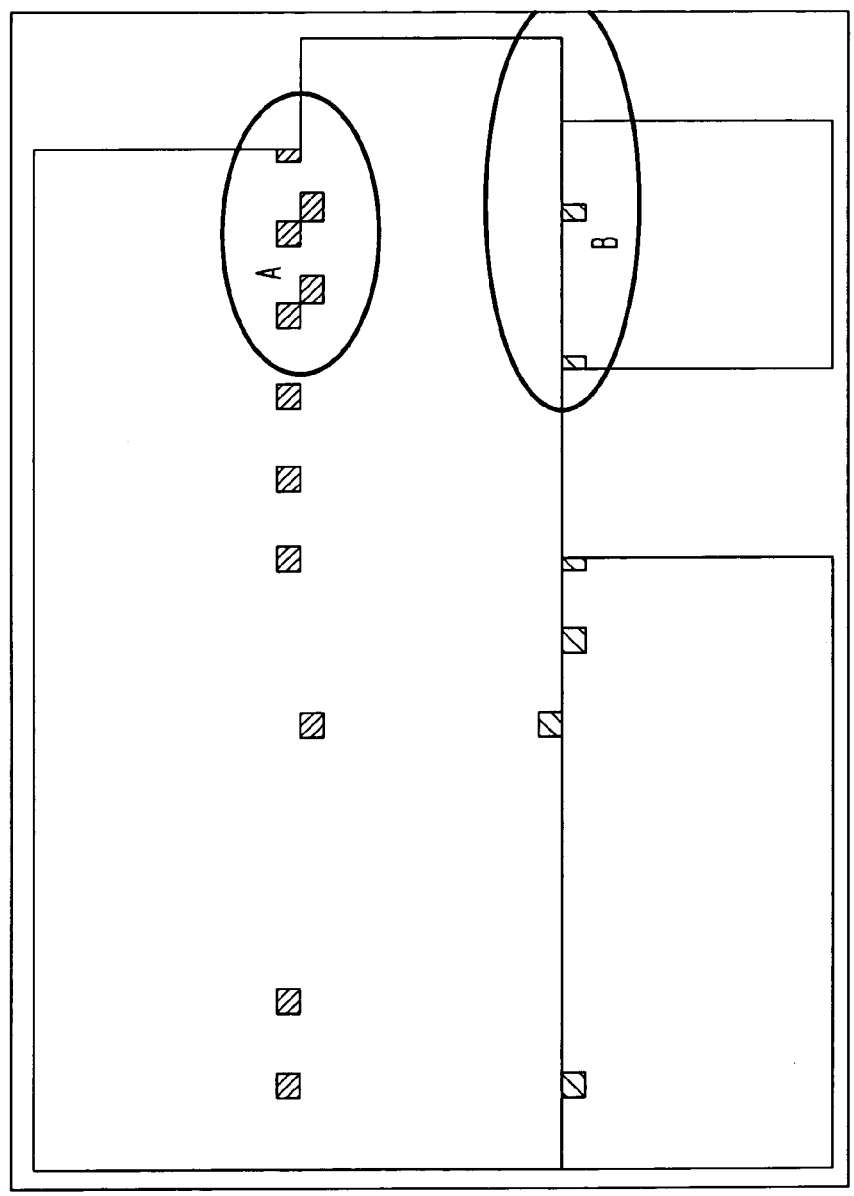
FIG. 11 illustrates the fill patterns of FIGS. 6 and 8.

In FIG. 9, the fill pattern of circle A from FIG. 8 is illustrated as merged with surrounding layer material. FIG. 11 illustrates the fill patterns of FIGS. 6 and 8. FIG. 10 illustrates the portion 300 of an integrated circuit layout, including the fill in pattern of FIGS. 6 and 8.

Figure 12:
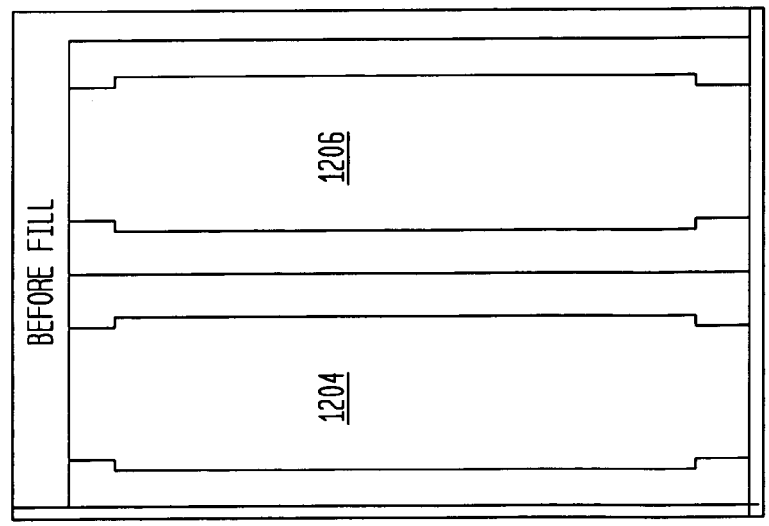
FIG. 12 illustrates an alternative detection pattern that runs along opposite edges of building blocks 1204 and 1206.

FIG. 12 illustrates an alternative detection pattern that runs along opposite edges of building blocks 1204 and 1206. The detection pattern is the darker portion on either side of the building blocks 1204 and 1206.

Figure 14:
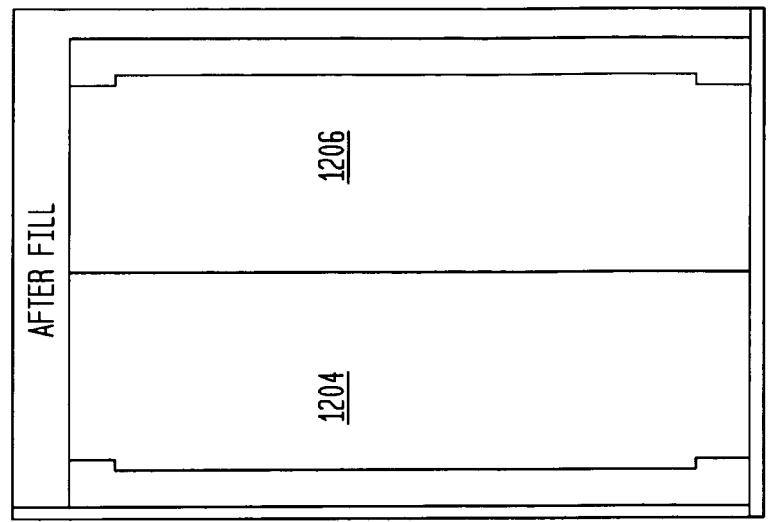
Figure 13:
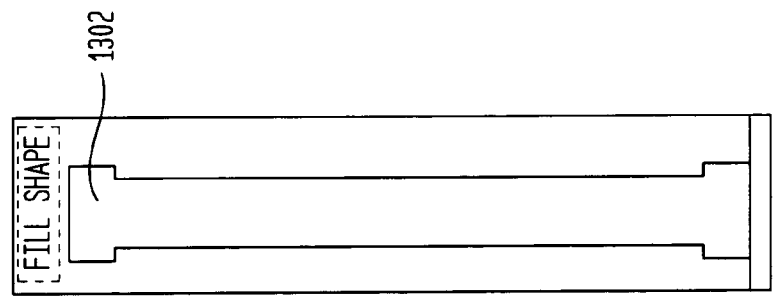
FIG. 13 illustrates an associated fill pattern 1302 that can be applied to the detection pattern between adjacent building blocks 1204 and 1206.

FIG. 13 illustrates an associated fill pattern 1302 that can be applied to the detection pattern between adjacent building blocks 1204 and 1206. FIG. 14 illustrates the building blocks 1204 and 1206 with the fill pattern 1302 there between.

Detection patterns are optionally designed or selected to accommodate design rules and/or design constraints associated with a fabrication facility.

The invention is not, however, limited to the example detection patterns and associated fill patterns described herein. Based on the description herein, one skilled in the relevant art(s) will understand that alternative detection patterns and associated fill patterns can be utilized.

V. Example Utilizations

There are a variety of ways of utilizing interchangeable integrated circuit building blocks.

In a first example, interchangeable integrated circuit building blocks are selected and/or interchanged as part of an optimization process. For example, and without limitation, a design is initially implemented (i.e., placed and routed) with a first type of integrated circuit building blocks, such as lower power, lower speed integrated circuit building blocks. During an optimization procedure, critical timing paths are identified. Critical timing paths are paths that do not meet specified timing constraints. Integrated circuit building blocks that are within critical timing paths are then interchanged with their higher speed integrated circuit building block equivalents, until the path meets the timing constraints.

The detection feature (e.g., corner notches) is used to differentiate integrated circuit building blocks that have different features. The detected integrated circuit building blocks are then examined for area, space, and/or width violations with respect to adjacent building blocks.

Since the functionally equivalent replacement integrated circuit building blocks have the same footprint as the building blocks that they replace, there is no need to re-run place and route operations.

In another example, integrated circuit building blocks are initially implemented (i.e., placed and routed) with a combination of integrated circuit building blocks having the first characteristic and integrated circuit building blocks having the second characteristic, as illustrated in FIG. 3. The detection feature (e.g., corner notches) is then used to detect the integrated circuit building blocks having the second feature. The detected building blocks are then examined for area, space, and/or width violations with respect to adjacent building blocks. Alternatively, the detection feature is provided in both the first and second versions of integrated circuit building blocks.

The invention is also useful for avoiding remaking of masks. When an integrated circuit design is generated, a separate mask is created for each layer of the integrated circuit. A typical integrated circuit chip can require, for example, twenty to thirty masks. Each mask can cost in the range of twenty to forty thousand dollars. Conventionally, if an integrated circuit block is changed after the masks are generated, multiple masks (sometimes all of the masks) must be re-created. In accordance with an aspect of the present invention, however, integrated circuit blocks can be interchanged with one another, and one or a few masks need to be re-created. This is because the only difference between integrated circuit blocks are the one or few associated layers (e.g., voltage threshold layers) that provide one or more associated different operating characteristics.

The process described above can be utilized before or after an integrated circuit chip is fabricated. For example, after a sample chip is received from a fabrication facility, and tested in a lab, one or more integrated circuit blocks can be interchanged with corresponding functionally equivalent integrated circuit blocks that provide one or more different operating characteristics. A new mask for the layer(s) associated with the one or more different operating characteristics is then generated. The new mask replaces the prior mask for the layer. The package of prior masks plus the new mask can be sent back to the fabrication facility for fabrication of a new integrated circuit chip. The process avoids unnecessary creation of additional masks.

In the process described above, a computer program generates information needed for the new mask, from which the new mask is generated. Optionally, the computer program re-generates mask information for the remaining layers. A check can then be performed to compare the computer-based mask information with prior computer-based mask information. This can serve as a check to insure that no other layers have changed when interchanging the integrated circuit building blocks.

Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method of generating a library of interchangeable integrated circuit building blocks, comprising:

generating a computer representation of a first integrated circuit building block that provides a logic functionality and a first characteristic, and that includes a footprint; and generating a computer representation of a second integrated circuit building block that provides the logic functionality and a second characteristic that is dissimilar to the first characteristic, the second integrated circuit building block including the footprint and a detection feature;

wherein the first and second integrated circuit building blocks are interchangeable with one another in an integrated circuit layout, without requiring re-running of place and route operations; and wherein the detection feature facilitates detection of instances of the second integrated circuit building block when placed in the integrated circuit layout.

2. The method according to claim 1, further comprising:

generating the first integrated circuit building block with a first layer that provides the first characteristic.

3. The method according to claim 2, further comprising:

generating the second integrated circuit building block with a second layer that provides the second characteristic.

4. The method according to claim 3, wherein the detection feature includes notched patterns formed in the second layer.

5. The method according to claim 3, wherein the detection feature includes notched patterns formed in the first and second layers.

6. The method according to claim 2, wherein the second characteristic is inherent to integrated circuit building blocks that are fabricated by a fabrication facility.

7. The method according to claim 2, wherein the detection feature includes notched patterns formed in the first layer.

8. A method of placing interchangeable integrated circuit building blocks generated according to claim 1, comprising:

placing and routing instances of integrated circuit building blocks into an integrated circuit layout, including at least one instance of the first integrated circuit building block;

replacing an instance of the first integrated circuit building block with an instance of the second integrated circuit building block;

searching the integrated circuit layout for the detection feature;

detecting area, space, and/or width rule violations associated with detected instances of the detection feature; and revising a layer associated with the second characteristic to correct for detected area, space, and/or width rule violations;

wherein place and route operations are not required when replacing the instance of the first integrated circuit building block with the instance of the second integrated circuit building block.

9. The method according to claim 8, wherein the detection feature comprises a detection feature in a layer associated with the second characteristic.

10. The method according to claim 9, wherein the detection feature indicates an absence of layer material.

11. The method according to claim 10, wherein the detection feature comprises a boundary notch.

12. The method according to claim 11, wherein the boundary notch comprises a corner notch.

13. The method according to claim 8, wherein the detection feature comprises a letter coding or naming convention.

14. A method of placing interchangeable integrated circuit building blocks generated according to claim 1, comprising:
   placing and routing instances of integrated circuit building blocks into an integrated circuit layout, including at least one instance of the first integrated circuit building block;
   identifying a critical timing path in the integrated circuit layout;
   replacing one or more instances of the first integrated circuit building block with instances of the second integrated circuit building block to reduce delay in the critical timing path;
   searching the integrated circuit layout for the detection feature;
   detecting area, space, and/or width rule violations associated with detected instances of the detection feature; and
   revising a layer associated with the second characteristic to correct for detected area, space, and/or width rule violations;
   wherein place and route operations are not required when replacing the instance of the first integrated circuit building block with the instance of the second integrated circuit building block.

15. The method according to claim 1, wherein the interchangeable building blocks allow selection of first and second characteristics on a building block by building block basis.

16. The method according to claim 1, further comprising:
   generating one or more additional integrated circuit building blocks that provide the logic functionality, each of the one or more additional integrated circuit building blocks including corresponding characteristics that are dissimilar to the first and second characteristics, the one or more additional integrated circuit building blocks including the footprint and the detection feature; and
   adding the first, second, and the one or more additional integrated circuit building blocks to a library of integrated circuit building block designs;
   wherein the first, second, and one or more additional integrated circuit building blocks are interchangeable with one another in the integrated circuit layout, without requiring re-running of place and route operations; and
   wherein the detection feature facilitates detection of instances of the second, and one or more additional integrated circuit building blocks when placed in the integrated circuit layout.

17. The method according to claim 1, wherein the first and second characteristics include radiation hardness.

18. The method according to claim 1, wherein the first and second characteristics include well depth.

19. The method according to claim 1, wherein the first and second characteristics include oxide thickness.

20. The method according to claim 1, wherein the first integrated circuit building block includes the detection feature.

21. A method of placing interchangeable integrated circuit building blocks generated according to claim 1, comprising:
   placing and routing instances of integrated circuit building blocks into an integrated circuit layout, including at least one instance of the first integrated circuit building block;
   generating computer information for fabricating masks for corresponding layers of the integrated circuit layout;
   generating the masks;
   fabricating an integrated circuit chip from the masks;
   analyzing performance characteristics of the fabricated integrated circuit chip;
   replacing an instance of the first integrated circuit building block with an instance of the second integrated circuit building block in the integrated circuit layout;
   re-generating the computer information for fabricating the masks;
   verifying that only the layer associated with the first and second characteristics has changed from the prior generation of the computer information;
   generating a new mask only for the layer associated with the first and second characteristic; and
   fabricating a second integrated circuit using the new mask for the layer associated with the first and second characteristic, and using the original masks for the remaining layers.

* * * * *